United States Patent
Ukei et al.

(10) Patent No.: US 11,387,566 B2
(45) Date of Patent: *Jul. 12, 2022

(54) ELECTROMAGNETIC WAVE ABSORBER AND MOLDED ARTICLE WITH ELECTROMAGNETIC WAVE ABSORBER

(71) Applicant: NITTO DENKO CORPORATION, Ibaraki (JP)

(72) Inventors: Hiroichi Ukei, Osaka (JP); Takehiro Ui, Osaka (JP); Hironobu Machinaga, Osaka (JP); Kazuto Yamagata, Osaka (JP); Yuuki Takeda, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 239 days.

This patent is subject to a terminal disclaimer.

(21) Appl. No.: 16/619,624

(22) PCT Filed: Jan. 23, 2018

(86) PCT No.: PCT/JP2018/002003
§ 371 (c)(1),
(2) Date: Dec. 5, 2019

(87) PCT Pub. No.: WO2018/230026
PCT Pub. Date: Dec. 20, 2018

(65) Prior Publication Data
US 2020/0161771 A1     May 21, 2020

(30) Foreign Application Priority Data
Jun. 13, 2017   (JP) .............................. JP2017-116292

(51) Int. Cl.
*B32B 7/025*     (2019.01)
*H01Q 17/00*    (2006.01)
(Continued)

(52) U.S. Cl.
CPC ............. *H01Q 17/00* (2013.01); *B32B 7/025* (2019.01); *B32B 15/046* (2013.01); *B32B 15/08* (2013.01);
(Continued)

(58) Field of Classification Search
CPC ....... B32B 7/025; B32B 15/046; B32B 15/08; B32B 2307/202; B32B 2307/204; B32B 2307/208
See application file for complete search history.

(56) References Cited

U.S. PATENT DOCUMENTS 10,512,200 B1 * 12/2019 Machinaga .......... H05K 9/0088
10,701,848 B2 *  6/2020 Yamagata ................. B32B 7/12
(Continued)

FOREIGN PATENT DOCUMENTS

CN       1586098 A     2/2005
CN     101512686 A     8/2009
(Continued)

OTHER PUBLICATIONS

Office Action dated Jul. 30, 2020, issued in counterpart CN application No. 201880039218.4, with English translation. (16 pages).
(Continued)

*Primary Examiner* — Elizabeth E Mulvaney
(74) *Attorney, Agent, or Firm* — WHDA, LLP

(57) ABSTRACT

An electromagnetic wave absorber (1a) includes a first layer (10) and an electrically conductive layer (20). The first layer (10) is a dielectric layer or a magnetic layer. The electrically conductive layer (20) is provided on at least one surface of the first layer. A product of a Young's modulus of the first layer (10) and a thickness of the first layer (10) is 0.1 to 1000 MPa·mm. The first layer (10) has a relative permittivity of 1 to 10.

13 Claims, 2 Drawing Sheets

(51) Int. Cl.
*B32B 15/04* (2006.01)
*B32B 15/08* (2006.01)
(52) U.S. Cl.
CPC ... *B32B 2307/202* (2013.01); *B32B 2307/204* (2013.01); *B32B 2307/208* (2013.01); *B32B 2457/00* (2013.01)

(56) References Cited

U.S. PATENT DOCUMENTS

| | | | |
|---|---|---|---|
| 11,145,988 B2* | 10/2021 | Ukei | H05K 9/0088 |
| 2005/0012652 A1 | 1/2005 | Wakayama et al. | |
| 2006/0216442 A1 | 9/2006 | Kamiya et al. | |
| 2010/0238063 A1 | 9/2010 | Ohkoshi et al. | |
| 2015/0042502 A1 | 2/2015 | Gorriti Gonzalez et al. | |
| 2015/0250078 A1 | 9/2015 | Matsuda et al. | |
| 2015/0289423 A1 | 10/2015 | Imahori et al. | |
| 2015/0334883 A1 | 11/2015 | Yamamoto | |
| 2016/0120077 A1 | 4/2016 | Watanabe | |
| 2016/0164187 A1 | 6/2016 | Ohkoshi et al. | |
| 2016/0254600 A1 | 9/2016 | Fixter et al. | |
| 2018/0104938 A1 | 4/2018 | Tomatsu et al. | |
| 2018/0319138 A1 | 11/2018 | Ukei et al. | |
| 2019/0269048 A1 | 8/2019 | Fujita et al. | |

FOREIGN PATENT DOCUMENTS

| | | | |
|---|---|---|---|
| CN | 102642354 A | 8/2012 | |
| JP | 5-335832 A | 12/1993 | |
| JP | 10-223003 A | 8/1998 | |
| JP | 2002-118008 A | 4/2002 | |
| JP | 2002-314284 A | 10/2002 | |
| JP | 2002-374091 A | 12/2002 | |
| JP | 2003-198179 A | 7/2003 | |
| JP | 2004-296758 A | 10/2004 | |
| JP | 2004-356325 A | 12/2004 | |
| JP | 2005-85966 A | 3/2005 | |
| JP | 2005-203438 A | 7/2005 | |
| JP | 2005-311330 A | 11/2005 | |
| JP | 2008-135485 A | 6/2008 | |
| JP | 2009-239211 A | 10/2009 | |
| JP | 2010-10100 A | 1/2010 | |
| JP | 2012-94764 A | 5/2012 | |
| JP | 2013-93464 A | 5/2013 | |
| JP | 2016-111341 A | 6/2016 | |
| WO | 2014/098065 A1 | 6/2014 | |
| WO | 2016/152835 A1 | 9/2016 | |

OTHER PUBLICATIONS

Na et al., "Mechanical Properties of Metal Materials", Metallurgical Industry Press, 2011, p. 40, with English translation, cited in CN Office Action dated Jul. 30, 2020. (6 pages).
Liu et al., "Physical Properties of Materials", Beihang University Press, 2015, p. 50, with English translation, cited in CN Office Action dated Jul. 30, 2020. (6 pages).
International Search Report dated Apr. 17, 2018, issued in counterpart application No. PCT/JP2018/002003 (2 pages).
Office Action dated Apr. 27, 2021, issued in counterpart JP application No. 2017-116292, with English translation. (9 pages).
Office Action dated Mar. 1, 2021, issued in counterpart CN Application No. 201880039218.4, with English translation (15 pages).
Extended Search Report dated Feb. 5, 2021, issued in counterpart EP Application No. 18816705.0 (10 pages).
International Search Report dated Sep. 11, 2018, issued in International Application No. PCT/JP2018/022481 (counterpart to U.S. Appl. No. 16/621,842), with English translation. (5 pages).
Notice of Allowance dated Jun. 30, 2020, issued in U.S. Appl. No. 16/621,842. (14 pages).
Office Action dated May 20, 2020, issued in CN application No. 201880039510.6 (counterpart to U.S. Appl. No. 16/621,842), with English translation. (11 pages).
Hashimoto, Osamu et al., "Reflection characteristics of the resistive sheet type wave absorber at 94 GHz frequency band", IEICE Technical Report, SCE97-1, MW97-1 (Apr. 1997), pp. 1-6, with English abstract, cited in JP Third Party Observation dated Oct. 26, 2021. (6 pages).
Third Party Observation dated Oct. 26, 2021, issued in counterpart JP application No. 2017-116292, with English translation. (47 pages).
Third Party Observation dated Nov. 2, 2021, issued in counterpart JP application No. 2017-116292. (1 pages).
Hashimoto, Osamu et al., "Reflection characteristics of the resistive sheet type wave absorber at 94 GHz Yequency band", IEICE Technical Report, SCE97-1, MW97-1 (Apr. 1997), pp. 1-6, with English abstract, cited in JP Third Party Observation dated Oct. 26, 2021. (6 pages).
Takizawa, Koji et al., "The transparent wave absorber using resistive-film for V band", IEICE Technical Report, EMCJ97-72, MW97-112 (Oct. 1997), pp. 145-152, with English abstract, cited in JP Third Party Observation dated Oct. 26, 2021. (8 pages).
Office Action dated Jan. 11, 2022, issued in counterpart JP application No. 2017-116292, with English translation. (10 pages).
International Search Report dated Feb. 27, 2018, issued in International Application No. PCT/JP2017/044443 issued in U.S. Appl. 16/488,418 (now U.S. Pat. No. 10,512,200). (1 page).
Decision to Grant a Patent dated Feb. 12, 2019, issued in Japanese Patent Application No. 2017-040839 issued in U.S. Appl. No. 16/488,418 (now U.S. Pat. No. 10/512,200), with English Translation. (6 pages).
Notification of Reasons for Refusal dated May 29, 2018, issued in Japanese Patent Application No. 2017-040839 issued in U.S. Appl. No. 16/488,418 (now U.S. Pat. No. 10,512,200), with English Translation. (14 pages).
Decision of Refusal dated Oct. 16, 2018, issued in Japanese Patent Application No. 2017-040839 issued in U.S. Appl. No. 16/488,418 (now U.S. Pat. No. 10,512,200), with English Translation. (12 pages).
Notice of Allowance dated Oct. 9, 2019, issued in U.S. Appl. No. 16/488,418 (now U.S. Pat. No. 10,512,200). (14 pages).

* cited by examiner

ELECTROMAGNETIC WAVE ABSORBER AND MOLDED ARTICLE WITH ELECTROMAGNETIC WAVE ABSORBER

TECHNICAL FIELD

The present invention relates to an electromagnetic wave absorber and a molded article with an electromagnetic wave absorber.

BACKGROUND ART

In recent years, electromagnetic waves in a range of millimeter waves having a wavelength of about 1 to 10 mm and a frequency of 30 to 300 GHz and quasi-millimeter waves have been used as information communication media. The use of such electromagnetic waves in anti-collision systems has been under consideration. An anti-collision system is a system, for example, installed in a vehicle, detecting obstacles to automatically put on the brakes, or measuring the speed of vehicles around the vehicle equipped with the system and distance between the vehicle and another vehicle to adjust the speed of the vehicle and distance between the two vehicles. To allow anti-collision systems to normally operate, reception of as few unnecessary electromagnetic waves as possible is important for prevention of false recognition. Therefore, it is conceivable to use an electromagnetic wave absorber to absorb electromagnetic waves unnecessary for anti-collision systems.

There are various types of electromagnetic wave absorbers classified according to their principles of electromagnetic wave absorption. For example, an electromagnetic wave absorber (which may be referred to as a "λ/4 electromagnetic wave absorber") provided with an electromagnetic wave reflective layer, a dielectric layer having a thickness of λ/4 (A is a wavelength of an electromagnetic wave to be absorbed) and a resistive film layer can be produced at a low cost owing to relatively inexpensive materials and ease of design. For example, Patent Literature 1 proposes an electromagnetic wave absorber that exhibits an excellent property of functioning in a wide incident angular range as a λ/4 electromagnetic wave absorber. Additionally, Patent Literature 2 describes an electromagnetic wave absorption material having a magnetic layer.

CITATION LIST

Patent Literature

Patent Literature 1: JP 2003-198179 A
Patent Literature 2: JP 2012-094764 A

SUMMARY OF INVENTION

Technical Problem

Patent Literatures 1 and 2 fail to discuss specifically the shapes of articles to which the electromagnetic wave absorbers are attached, and also fail to discuss specifically electromagnetic wave absorption performance in a broad bandwidth.

Therefore, the present invention provides an electromagnetic wave absorber that is advantageous in attaching to a non-flat face and that exhibits excellent electromagnetic wave absorption performance in a broad bandwidth.

Solution to Problem

The present invention provides an electromagnetic wave absorber including:

a first layer that is a dielectric layer or a magnetic layer; and an electrically conductive layer that is provided on at least one surface of the first layer, wherein a product of a Young's modulus of the first layer and a thickness of the first layer is 0.1 to 1000 MPa·mm, and the first layer has a relative permittivity of 1 to 10.

The present invention also provides a molded article with an electromagnetic wave absorber, including:

a molded article; and the above electromagnetic wave absorber attached to the molded article.

Advantageous Effects of Invention

The above electromagnetic wave absorber can be attached easily to a non-flat face as well, and it also exhibits excellent electromagnetic wave absorption performance in a broad bandwidth (such as a bandwidth of 2 GHz or more included in a frequency band of 50 to 100 GHz).

DESCRIPTION OF EMBODIMENTS

Figure 1:
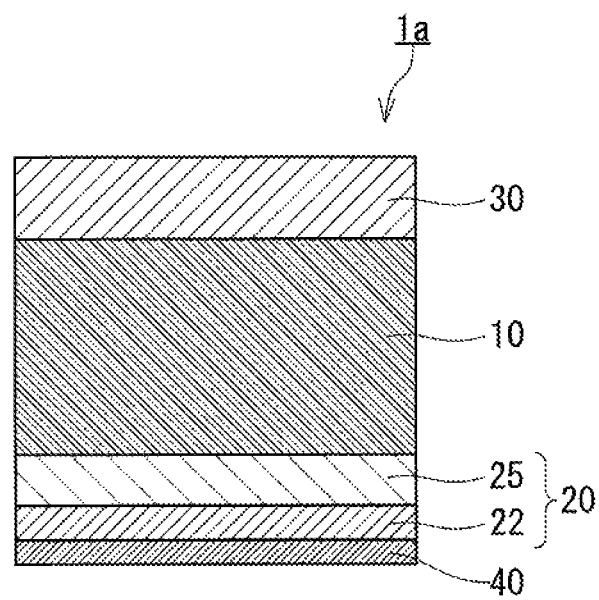
FIG. 1 is a cross-sectional view showing an example of an electromagnetic wave absorber of the present invention.

Hereinafter, embodiments of the present invention will be described with reference to the drawings. The following description describes examples of the present invention, and the present invention is not limited to the following embodiments.

If electromagnetic wave absorbers can be adhered to a non-flat face such as a curved face, the application range of electromagnetic wave absorbers expands. An exemplary application of electromagnetic wave absorbers is an anti-collision system installed in a motor vehicle. Most millimeter-wave radars of conventional anti-collision systems emit a millimeter wave ahead of a motor vehicle, and electromagnetic wave absorbers tend to be adhered to a flat face. However, if a millimeter wave can also be emitted obliquely forward or obliquely backward from a motor vehicle to detect obstacles, vehicle driving safety can be enhanced more. Accordingly, it is conceivable that a millimeter-wave radar will be disposed at a corner of a motor vehicle. In this case, an electromagnetic wave absorber is desirably adhered to an end of an automotive part such as a bumper to prevent electromagnetic wave interference, and a demand for an electromagnetic wave absorber easily adhered to a non-flat face such as a curved face is expected to increase.

Moreover, for the millimeter-wave radars of anti-collision systems, it is attempted to broaden the bandwidth of frequency to be used in order to enhance the resolutions of the radars. For example, for millimeter-wave radars of anti-collision systems that use an electromagnetic wave having a frequency of 76 GHz and millimeter-wave radars of anti-collision systems that use an electromagnetic wave having a frequency of 79 GHz, bands to be used are specified respectively to be 1 GHz and 4 GHz in some cases. Therefore, it is desirable that electromagnetic wave absorbers can exhibit good electromagnetic wave absorption performance in a broad bandwidth (such as a bandwidth of 2 GHz or more included in a frequency band of 50 to 100 GHz).

In addition, it is expected that a plurality of millimeter-wave radars that respectively utilize electromagnetic waves having different frequencies will be used in an anti-collision system. In this case, preparing a different type of electromagnetic wave absorber for every millimeter-wave radar increases the number of parts of the anti-collision system and may raise the production cost of the anti-collision system. Moreover, preparing a different type of electromagnetic wave absorber for every millimeter-wave radar may increase the gross weight of the anti-collision system. Thus, in the case where a plurality of millimeter-wave radars that respectively utilize electromagnetic waves having different frequencies are used in an anti-collision system, the presence of an electromagnetic wave absorber that can exhibit good electromagnetic wave absorption performance in a broad bandwidth makes it unnecessary to prepare a different type of electromagnetic wave absorber for every millimeter-wave radar.

In view of the foregoing, the present inventors made intensive studies on an electromagnetic wave absorber that can be attached easily to a non-flat face as well and that exhibits excellent electromagnetic wave absorption performance in a broad bandwidth. As a result, they have invented an electromagnetic wave absorber according to the present invention. It should be noted that a motor vehicle-installed anti-collision system is merely an exemplary application of the electromagnetic wave absorber.

As shown in FIG. 1, an electromagnetic wave absorber 1a includes a first layer 10 and an electrically conductive layer 20. The first layer 10 is a dielectric layer or a magnetic layer. The electrically conductive layer 20 is provided on at least one surface of the first layer 10. A product of a Young's modulus (a tensile elastic modulus) of the first layer 10 and a thickness of the first layer 10 is 0.1 to 1000 MPa·mm. Also, the first layer 10 has a relative permittivity of 1 to 10. Due to the fact that the product of the Young's modulus of the first layer 10 and the thickness of the first layer is 0.1 to 1000 MPa·mm, the electromagnetic wave absorber 1a can be attached easily to a non-flat face as well. In addition, due to the fact that the first layer 10 has a relative permittivity of 1 to 10, the electromagnetic wave absorber 1a can exhibit good electromagnetic wave absorption performance in a broad bandwidth (such as a bandwidth of 2 GHz or more included in a frequency band of 50 to 100 GHz). In the present description, the Young's modulus of the first layer 10 means a value measured in compliance with Japanese Industrial Standards (JIS) K7161-1:2014 at a normal temperature. The relative permittivity of the first layer 10 can be measured by a cavity resonator perturbation method.

The electromagnetic wave absorber 1a exhibits, for example, an electromagnetic wave absorption of 20 dB or more in a bandwidth of 2 GHz or more included in a frequency band of 50 to 100 GHz. As just described, the electromagnetic wave absorber 1a can exhibit good electromagnetic wave absorption performance in a broad bandwidth. The electromagnetic wave absorption that the electromagnetic wave absorber 1a exhibits can be measured by irradiating the electromagnetic wave absorber 1a with an electromagnetic wave set at an incidence angle of 15° in compliance with JIS R 1679: 2007.

In view of making it easier to attach the electromagnetic wave absorber 1a to a non-flat face, the product of the Young's modulus of the first layer 10 and the thickness of the first layer is desirably 0.1 to 1000 MPa·mm, more desirably 0.1 to 500 MPa·mm, even more desirably 0.1 to 100 MPa·mm, particularly desirably 0.1 to 50 MPa·mm, and most desirably 0.1 to 20 MPa·mm.

In view of adjusting the product of the Young's modulus of the first layer 10 and the thickness of the first layer 10 to be 0.1 to 1000 MPa·mm, the Young's modulus of the first layer 10 is desirably 2000 MPa or less. This makes it easy to adjust the product of the Young's modulus of the first layer 10 and the thickness of the first layer to be 0.1 to 1000 MPa·mm even in the case where the thickness of the first layer 10 cannot be changed largely.

The first layer 10 contains a polymer material, for example. Examples of the polymer material contained in the first layer 10 include a synthetic resin (including a thermoplastic elastomer) such as an acrylic resin, an ethylene vinyl acetate copolymer (EVA), polyvinyl chloride, polyurethane, an acryl urethane resin, ionomer, polyolefin, polypropylene, polyethylene, a silicone resin, polyester, polystyrene, polyimide, polyamide, polysulfone, polyether sulfone and an epoxy resin, and synthetic rubber such as polyisoprene rubber, polystyrene-butadiene rubber, polybutadiene rubber, polychloroprene rubber, acrylonitrile butadiene rubber, butyl rubber, acrylic rubber, ethylene propylene rubber and silicone rubber. One of these may be used alone as the polymer material contained in the first layer 10, or a combination of two or more thereof may be used as the polymer material contained in the first layer 10. Among these, the polymer material contained in the first layer 10 is desirably an acrylic resin, an ethylene vinyl acetate copolymer (EVA), polyolefin, polyethylene or silicone rubber in the view of lowering the relative permittivity of the first layer 10.

The first layer 10 may be a foam, for example. In this case, the relative permittivity of the first layer 10 is likely to be low. In addition, the weight of the first layer 10 can be reduced.

At least one of a dielectric substance and a magnetic substance may be dispersed in the first layer 10. In this case, the above-mentioned polymer material functions as a matrix, for example. By adjusting the types and amounts of the dielectric substance and/or the magnetic substance dispersed in the first layer 10, it is possible to allow the electromagnetic wave absorber 1a to exhibit desired electromagnetic wave absorption characteristics. Examples of the dielectric substance dispersed in the first layer 10 include an inorganic material such as carbon, a titanium oxide, alumina and barium titanate. The amounts of the dielectric substance and/or the magnetic substance dispersed in the first layer 10 are adjusted so that the relative permittivity of the first layer 10 is 1 to 10.

In view of making it easier to attach the electromagnetic wave absorber 1a to a non-flat face, it is desirable that a product of a Young's modulus of the electrically conductive layer 20 and a thickness of the electrically conductive layer 20 be small. On the other hand, since the product of the Young's modulus of the first layer 10 and the thickness of the first layer 10 is adjusted to be as significantly small as 0.1 to 1000 MPa·mm, the upper limit of the product of the Young's modulus of the electrically conductive layer 20 and the thickness of the electrically conductive layer 20 does not need to be adjusted to be as low as the counterpart of the first layer 10. Thus, the product of the Young's modulus of the electrically conductive layer 20 and the thickness of the electrically conductive layer 20 is typically 12000 MPa·mm or less. This makes it easy to attach the electromagnetic wave absorber 1a to a non-flat face.

The product of the Young's modulus of the electrically conductive layer 20 and the thickness of the electrically conductive layer 20 is desirably 10000 MPa·mm or less, and more desirably 8000 MPa·mm or less.

In view of making it easier to attach the electromagnetic wave absorber 1a to a non-flat face, it is desirable, basically, that the product of the Young's modulus of the electrically conductive layer 20 and the thickness of the electrically conductive layer 20 be as small as possible. On the other hand, in the case where the electromagnetic wave absorber 1a is required to have high durability in a state in which the electromagnetic wave absorber 1a is attached to a non-flat face, it is desirable to adjust the product of the Young's modulus of the electrically conductive layer 20 and the thickness of the electrically conductive layer 20 to be equal to or greater than a predetermined value. From such a viewpoint, the product of the Young's modulus of the electrically conductive layer 20 and the thickness of the electrically conductive layer 20 is desirably 10 MPa·mm or more, more desirably 20 MPa·mm or more, and even more desirably 50 MPa·mm or more.

The entirety of the electrically conductive layer 20 does not necessarily have to be formed of an electrically conductive material. For example, the electrically conductive layer 20 may include an electrically conductive functional layer 22 formed of an electrically conductive material and a non-electrically conductive layer that is in contact with the electrically conductive functional layer 22.

The electrically conductive layer 20 desirably contains a metal. This allows the electrically conductive layer 20 to have low sheet resistance. It should be noted that alloys are included in metals herein. Examples of the metal contained in the electrically conductive layer 20 include copper, nickel, zinc, their alloys, aluminum, gold and stainless steel. The electrically conductive layer 20 may be made of a metal oxide, such as an indium tin oxide (ITO), in some cases.

As shown in FIG. 1, the electrically conductive layer 20 includes, for example, the electrically conductive functional layer 22 formed of an electrically conductive material. In the electrically conductive layer 20, the electrically conductive functional layer 22 reflects electromagnetic waves and prevents the electromagnetic waves from passing therethrough. In order to allow the electrically conductive layer 20 to prevent the electromagnetic waves from passing therethrough and to maintain good electromagnetic wave absorption characteristics over a long period of time in a state in which the electromagnetic wave absorber 1a is attached to a non-flat face, it is desirable that the electrically conductive functional layer 22 have a thickness equal to or greater than a predetermined value. On the other hand, it is desirable that the electrically conductive functional layer 22 have a thickness equal to or less than a predetermined value in order to allow the product of the Young's modulus of the electrically conductive layer 20 and the thickness of the electrically conductive layer 20 to be in the above-mentioned range. Therefore, the thickness of the electrically conductive functional layer 22 is 5 μm to 1 mm, for example.

Desirably, the electrically conductive functional layer 22 is formed not of a deposited film but of metal foil in order to have the above-mentioned thickness. Examples of the metal foil include aluminum foil, copper foil, gold foil, titanium foil, nickel foil, magnesium foil, aluminum alloy foil, copper alloy foil, gold alloy foil, titanium alloy foil, nickel alloy foil, magnesium alloy foil and stainless steel foil. Among these, aluminum foil is desirably used as the metal foil. This is because aluminum foil is available at a low price and the production cost of the electromagnetic wave absorber 1a can be reduced.

As shown in FIG. 1, the electrically conductive layer 20 includes, for example, a support 25 and the electrically conductive functional layer 22 that has electrical conductivity and is in contact with the support 25. In this case, the support 25 is disposed between the first layer 10 and the electrically conductive functional layer 22 and the support 25 protects the electrically conductive functional layer 22. If the electrically conductive functional layer 22 is in direct contact with the first layer 10, for example, there is a possibility that a composition contained in the first layer 10 is spread into the electrically conductive functional layer 22 and the electrically conductive functional layer 22 is deteriorated. In addition, if a glue or adhesive for joining the first layer 10 to the electrically conductive functional layer 22 adheres to the electrically conductive functional layer 22, there is a possibility that a composition contained in the glue or adhesive deteriorates the electrically conductive functional layer 22. Furthermore, in the case where the electromagnetic wave absorber 1a is attached to a non-flat face, the electrically conductive functional layer 22 may be deteriorated easily even by a small impact because the electrically conductive functional layer 22 is bent. However, because of the fact that the electrically conductive functional layer 22 is protected by the support 25, the electrically conductive functional layer 22 is unlikely to be deteriorated and it is easy for the electromagnetic wave absorber 1a to exhibit desired electromagnetic wave absorption performance over a long period of time. In the case where the electrically conductive functional layer 22 has a sufficient thickness (20 μm or more, for example), the support 25 can be omitted and the electrically conductive layer 20 may be formed only of the electrically conductive functional layer 22.

A ratio (a thickness of the electrically conductive functional layer 22:a thickness of the support 25) between the thickness of the electrically conductive functional layer 22 and the thickness of the support 25 is preferably 1:0.1 to 1:10. If the ratio of the thickness of the electrically conductive functional layer to the thickness of the support is low, an electromagnetic wave absorber has good flexibility but the electrically conductive functional layer is deteriorated easily. If the ratio of the thickness of the electrically conductive functional layer to the thickness of the support is high, the electrically conductive functional layer is unlikely to be deteriorated in an electromagnetic wave absorber but it is difficult to increase the flexibility of the electromagnetic wave absorber. When the ratio of the thickness of the electrically conductive functional layer 22 to the thickness of the support 25 is in the above-mentioned range, both of the good flexibility and the good protection of the electrically conductive functional layer can be achieved easily in the electromagnetic wave absorber 1a.

As mentioned above, the support 25 serves to support the electrically conductive functional layer 22 as well as to protect the electrically conductive functional layer 22. Therefore, it is desirable that the support 25 be made of a material that has good heat resistance and good chemical durability. Thus, the support 25 is made of, for example, a polyester resin such as polyethylene terephthalate (PET) and polyethylene naphthalate (PEN).

As shown in FIG. 1, the electromagnetic wave absorber 1a further includes, for example, a resistive layer 30. The resistive layer 30 is provided on at least one surface of the first layer 10. In this case, the first layer 10 is a dielectric layer and disposed between the resistive layer 30 and the electrically conductive layer 20. In other words, the electromagnetic wave absorber 1a is a λ/4 electromagnetic wave absorber.

In the case where the electromagnetic wave absorber 1a is a λ/4 electromagnetic wave absorber, the electromagnetic wave absorber 1a is designed so that incidence of an electromagnetic wave having a wavelength ($\lambda_O$) to be absorbed will result in interference between the electromagnetic wave reflected by a surface of the resistive layer 30 (front surface reflection) and the electromagnetic wave reflected by the electrically conductive layer 20 (back surface reflection). Therefore, if the sheet resistance of the electrically conductive layer 20 is high, an electromagnetic wave passes through the electrically conductive layer 20 and the electromagnetic wave absorption that the electromagnetic wave absorber 1a exhibits is decreased. In the λ/4 electromagnetic wave absorber, the wavelength ($\lambda_O$) of an electromagnetic wave to be absorbed is determined according to the thickness (t) of the first layer 10 that is a dielectric layer and the relative permittivity ($\varepsilon_r$) of the dielectric layer, as shown in the following equation (1). That is, an electromagnetic wave having a wavelength to be absorbed can be set by appropriately adjusting the material and thickness of the first layer 10 that is a dielectric layer. In the equation (1), sqrt ($\varepsilon_r$) means a square root of the relative permittivity ($\varepsilon_r$).

$$\lambda_O = 4t \times sqrt(\varepsilon_r) \qquad \text{Equation (1)}$$

As described above, the resistive layer 30 is disposed to reflect an electromagnetic wave having a wavelength to be absorbed in the vicinity of a surface of the electromagnetic wave absorber 1a. The resistive layer 30 has a sheet resistance of, for example, 200 to 600Ω/□ and desirably 360 to 500Ω/□. This makes it easy for the electromagnetic wave absorber 1a to selectively absorb an electromagnetic wave having a wavelength generally employed by a millimeter-wave radar or quasi-millimeter-wave radar. For example, the electromagnetic wave absorber 1a can effectively attenuate an electromagnetic wave having a frequency of 50 to 100 GHz, particularly 60 to 90 GHz, employed by a millimeter-wave radar.

The resistive layer 30 includes, for example, a layer (hereinafter referred to as a "resistive functional layer") formed of: a metal oxide containing, as a main component, at least one selected from the group consisting of indium, tin and zinc; a polymer having electrical conductivity; a carbon nanotube; a metal nanowire; or a metal mesh. In particular, the resistive functional layer of the resistive layer 30 is desirably formed of an indium tin oxide (ITO) in terms of the stability of the sheet resistance in the resistive layer 30 and durability of the resistive layer 30. In this case, the material forming the resistive functional layer of the resistive layer 30 is desirably an ITO containing 20 to 40 weight % of $SnO_2$ and more desirably an ITO containing 25 to 35 weight % of $SnO_2$. An ITO containing $SnO_2$ in such a range has an extremely stable amorphous structure and can reduce variation in sheet resistance of the resistive layer 30 in a hot and humid environment. The sheet resistance of the resistive layer 30 refers to a value obtained by measuring, for example, a surface defined by the resistive functional layer. In the present description, a "main component" means a component having the largest content on mass basis.

The resistive functional layer of the resistive layer 30 has a thickness of, for example, 10 to 100 nm and desirably 25 to 50 nm. This makes it likely that the sheet resistance of the resistive layer 30 is stable even in the case where the electromagnetic wave absorber 1a is used over a long period of time in the state of being attached to a non-flat face.

The resistive layer 30 may further include, for example, a support supporting the resistive functional layer. In this case, the resistive layer 30 can be produced, for example, by forming the resistive functional layer on the support by a layer forming method such as sputtering and coating (bar coating, for example). In this case, the support also serves as an auxiliary member capable of adjusting the thickness of the resistive functional layer with high accuracy. In this case, examples of a material of the support of the resistive layer 30 include a polyester resin such as polyethylene terephthalate (PET) and polyethylene naphthalate (PEN), an acrylic resin, polycarbonate (PC), polyolefin, polyethylene (PE), polypropylene (PP), cycloolefin polymer (COP), polyurethane, a urethane acrylic resin, biaxially-oriented polypropylene (BOPP) and a vinylidene chloride resin. The material of the support of the resistive layer 30 may be the same as the material of the support of the electrically conductive layer 20, or may be different from the material of the support of the electrically conductive layer 20. In particular, the material of the support of the resistive layer is desirably PET in terms of the balance among good heat-resistance, the dimensional stability and cost. The support can be omitted from the resistive layer 30 as appropriate.

In the resistive layer 30 including the support, the resistive functional layer may be disposed closer to the first layer 10 than is the support, or the support may be disposed closer to the first layer 10 than is the resistive functional layer.

The support of the resistive layer 30 has a thickness of, for example, 10 to 150 μm, desirably 20 to 100 μm, and more desirably 30 to 80 μm. This can decrease the flexural rigidity of the resistive layer 30, and can reduce occurrence of a crease or deformation in the case where the resistive functional layer of the resistive layer 30 is formed.

The first layer 10 that is a dielectric layer may be a single layer, or may be a laminate composed of a plurality of layers. In the case where the first layer 10 is a laminate composed of a plurality of layers, the relative permittivity of the first layer 10 can be determined by measuring the respective layers for relative permittivity, multiplying the obtained relative permittivity values of the respective layers by the proportions of the thicknesses of the respective layers to the thickness of the entirety of the first layer 10, and adding the resultant values.

In the case where the electromagnetic wave absorber 1a is a λ/4 electromagnetic wave absorber and a dielectric layer is disposed on an external side of the resistive layer 30, only a non-porous layer having a relative permittivity of 2 or more is disposed as such a dielectric layer. If a porous body is provided on a surface of an electromagnetic wave absorber and the electromagnetic wave absorber is left in a humid environment over a long period of time, the electromagnetic wave absorbing properties of the electromagnetic wave absorber may decrease due to moisture absorption.

As shown in FIG. 1, the electromagnetic wave absorber 1a further includes, for example, an adhesive layer 40. In this case, the adhesive layer 40 is disposed on an external side of the electrically conductive layer 20. This makes it easy to attach the electromagnetic wave absorber 1a to an article such as a molded article.

The adhesive layer 40 contains an adhesive such as an acrylic adhesive, a rubber adhesive, a silicone adhesive and a urethane adhesive.

Figure 2:
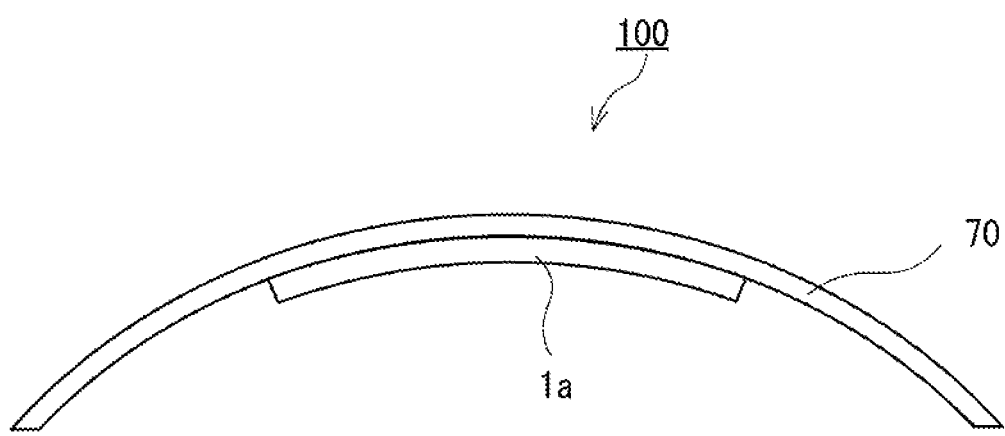
FIG. 2 is a side view showing an example of a molded article with an electromagnetic wave absorber of the present invention.

As shown in FIG. 2, it is possible, for example, to produce a molded article 100 with an electromagnetic wave absorber by using the electromagnetic wave absorber 1a. The molded article 100 with an electromagnetic wave absorber includes a molded article 70 and the electromagnetic wave absorber 1a attached to the molded article 70. Examples of the molded article 70 include an automotive component such as a bumper.

An example of a method for producing the electromagnetic wave absorber 1a will be described. The resistive functional layer is formed on a support formed in a sheet shape by a layer forming method such as vapor deposition, sputtering and coating (bar coating, for example) to produce the resistive layer 30. It is desirable that the resistive functional layer of the resistive layer 30 be formed by, in particular, sputtering to strictly adjust the sheet resistance of the resistive layer 30 and the thickness of the resistive functional layer of the resistive layer 30. As the electrically conductive layer 20, a laminate including the support 25 and the electrically conductive functional layer 22 is prepared, for example.

Next, a resin composition that has been press-molded to have a predetermined thickness and that forms the first layer 10 is put on one principal surface (a principal surface formed by the support 25) of the electrically conductive layer 20. Afterward, one principal surface of the resistive layer 30 is placed on the resin composition forming the first layer 10. The resin composition is cured if necessary. The electromagnetic wave absorber 1a can be produced in this manner. According to this method, the thickness of the first layer 10 is controlled easily, and thus the electromagnetic wave absorber 1a can be produced so that an electromagnetic wave having a wavelength to be absorbed can be absorbed effectively. Moreover, since the resistive layer 30 and the electrically conductive layer 20 are formed separately, the time required to produce the electromagnetic wave absorber 1a is short and the production cost of the electromagnetic wave absorber 1a is low. As the electrically conductive layer 20, a layer that is composed only of the electrically conductive functional layer 22 may be used. A glue or adhesive may be used for joining the first layer 10 to the electrically conductive layer 20 and/or to the resistive layer 30.

<Modification>

Figure 3:
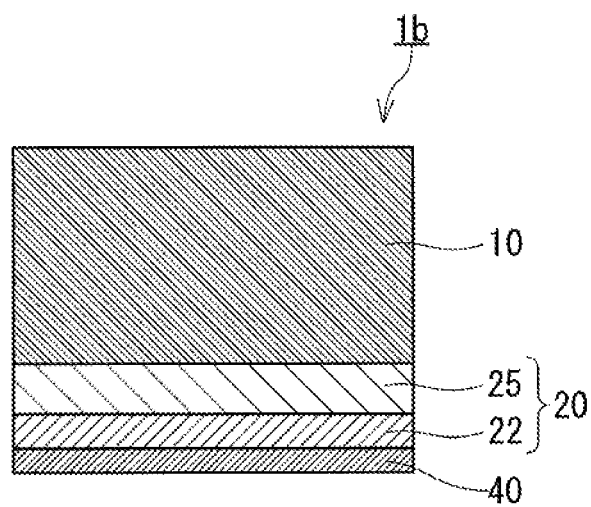
FIG. 3 is a cross-sectional view showing another example of the electromagnetic wave absorber of the present invention.

The electromagnetic wave absorber 1a may be modified into an electromagnetic wave absorber 1b shown in FIG. 3. The electromagnetic wave absorber 1b is configured in the same manner as the electromagnetic wave absorber 1a unless otherwise described. The components of the electromagnetic wave absorber 1b that are identical to or corresponding to the components of the electromagnetic wave absorber 1a are indicated by the same reference numerals and detailed descriptions thereof are omitted. The descriptions given for the electromagnetic wave absorber 1a are applicable to the electromagnetic wave absorber 1b unless there is a technical inconsistency.

As shown in FIG. 3, the electromagnetic wave absorber 1b includes the first layer 10 and the electrically conductive layer 20, but does not include the resistive layer 30. The first layer 10 is a dielectric layer or a magnetic layer. In the case where the first layer 10 is a dielectric layer, the electromagnetic wave absorber 1b is a dielectric loss-type electromagnetic wave absorber absorbing an electromagnetic wave using a dielectric loss attributed to molecular polarization. In the dielectric loss-type electromagnetic wave absorber, the molecular polarization cannot follow a change in an electric field and the energy of an electromagnetic wave is lost as heat. In this case, in the first layer 10, dielectric substance particles, such as carbon particles and barium titanate (BaTiO$_3$) particles, are dispersed, for example, in the synthetic resin or synthetic rubber mentioned above as the polymer material of the first layer 10 that is a dielectric layer. The content of the dielectric substance particles in the first layer 10 is adjusted so that the first layer 10 has a relative permittivity of 1 to 10.

In the case where the first layer 10 is a magnetic layer, the electromagnetic wave absorber 1b is a magnetic loss-type electromagnetic wave absorber absorbing an electromagnetic wave by means of a magnetic loss of a magnetic material. In the magnetic loss-type electromagnetic wave absorber, a magnetic moment cannot follow a change in a magnetic field and the energy of an electromagnetic wave is lost as heat. In this case, in the first layer 10, particles of a magnetic substance, such as ferrite, iron and nickel, are dispersed, for example, in the synthetic resin or synthetic rubber mentioned above as the polymer material of the first layer 10 that is a dielectric layer. The content of the magnetic substance particles in the first layer 10 is controlled so that the first layer 10 has a relative permittivity of 1 to 10.

EXAMPLES

Hereinafter, the present invention will be described in more detail with reference to examples. The present invention is not limited to the examples given below.

Example 1

On a film-like support (Mitsubishi DIAFOIL with a thickness of 38 μm, available from Mitsubishi Chemical Corporation) made of polyester, a resistive functional layer was formed by sputtering using an ITO containing 30 weight % of SnO$_2$ so as to have a sheet resistance of 380Ω/□. A resistive layer according to Example 1 was thus produced. As an electrically conductive layer according to Example 1, an aluminum foil-including PET film, available from UACJ Corporation, in which a 25-μm-thick PET layer, a 7-μm-thick aluminum foil and a 9-μm-thick PET layer were stacked in this order was prepared. An acrylic resin (KURARITY LA2330 available from KURARAY CO., LTD.) that was a dielectric layer according to Example 1 and that had been press-molded to have a thickness of 560 μm was put on the 25-μm-thick PET layer of the electrically conductive layer according to Example 1. Next, the resistive layer according to Example 1 was placed on the acrylic resin (the dielectric layer) in the state in which a principal surface formed by the support of the resistive layer faces the acrylic resin. An electromagnetic wave absorber according to Example 1 was obtained in this manner. The dielectric layer of the electromagnetic wave absorber according to Example 1 had a relative permittivity of 2.55.

Example 2

On a film-like support (Mitsubishi DIAFOIL with a thickness of 38 μm, available from Mitsubishi Chemical Corporation) made of polyester, an electrically conductive functional layer was formed by sputtering using an ITO containing 10 weight % of SnO$_2$ to have a sheet resistance of 20Ω/□. An electrically conductive layer according to Example 2 was thus produced. An electromagnetic wave absorber according to Example 2 was obtained in the same manner as in Example 1, except that the electrically conductive layer according to Example 2 was used instead of the electrically conductive layer according to Example 1. The electrically conductive functional layer of the electrically conductive layer according to Example 2 faced the acrylic resin that was the dielectric layer.

Example 3

An EVA resin (EVAFLEX EV250 with a relative permittivity of 2.45, available from Du Pont-Mitsui Fluorochemicals Co., Ltd.) was press-molded at 120° C. to obtain a dielectric layer according to Example 3 having a thickness of 560 µm. An electromagnetic wave absorber according to Example 3 was obtained in the same manner as in Example 1, except that the dielectric layer according to Example 3 was used instead of the dielectric layer according to Example 1.

Example 4

50 parts by weight of barium titanate powder (product name: BT-01, available from Sakai Chemical Industry Co., Ltd.) was added to 100 parts by weight of an EVA resin (EVAFLEX EV250 available from Du Pont-Mitsui Fluorochemicals Co., Ltd.), and the resultant mixture was kneaded with a mixing roll. Then the kneaded mixture was press-molded at 120° C. to obtain a dielectric layer according to Example 4 having a thickness of 456 µm. The dielectric layer according to Example 4 had a relative permittivity of 3.90. An electromagnetic wave absorber according to Example 4 was obtained in the same manner as in Example 1, except that the dielectric layer according to Example 4 was used instead of the dielectric layer according to Example 1.

Example 5

100 parts by weight of barium titanate powder (product name: BT-01, available from Sakai Chemical Industry Co., Ltd.) was added to 100 parts by weight of an EVA resin (EVAFLEX EV250 available from Du Pont-Mitsui Fluorochemicals Co., Ltd.), and the resultant mixture was kneaded with a mixing roll. Then the kneaded mixture was press-molded at 120° C. to obtain a dielectric layer according to Example 5 having a thickness of 397 µm. The dielectric layer according to Example 5 had a relative permittivity of 5.19. An electromagnetic wave absorber according to Example 5 was obtained in the same manner as in Example 1, except that the dielectric layer according to Example 5 was used instead of the dielectric layer according to Example 1.

Example 6

200 parts by weight of barium titanate powder (product name: BT-01, available from Sakai Chemical Industry Co., Ltd.) was added to 100 parts by weight of an EVA resin (EVAFLEX EV250 available from Du Pont-Mitsui Fluorochemicals Co., Ltd.), and the resultant mixture was kneaded with a mixing roll. Then the kneaded mixture was press-molded at 120° C. to obtain a dielectric layer according to Example 6 having a thickness of 336 µm. The dielectric layer according to Example 6 had a relative permittivity of 7.25. An electromagnetic wave absorber according to Example 6 was obtained in the same manner as in Example 1, except that the dielectric layer according to Example 6 was used instead of the dielectric layer according to Example 1.

Example 7

An olefin foam (product name: SCF 100, with a relative permittivity of 1.07, available from Nitto Denko Corporation) was sliced to obtain a dielectric layer according to Example 7 having a thickness of 0.82 mm. The dielectric layer according to Example 7 was joined to the electrically conductive layer according to Example 1, with an acrylic adhesive having a thickness of 30 µm being present between the 25-µm-thick PET layer of the electrically conductive layer according to Example 1 and the dielectric layer according to Example 7. Next, the dielectric layer according to Example 7 was joined to the resistive layer according to Example 1, with an acrylic adhesive having a thickness of 30 µm being present between the dielectric layer according to Example 7 and the resistive layer according to Example 1, in the state in which the principal surface formed by the support of the resistive layer according to Example 1 faces the dielectric layer according to Example 7. An electromagnetic wave absorber according to Example 7 was obtained in this manner.

Example 8

A polyester foam (product name: SCF T100, with a relative permittivity of 1.09, available from Nitto Denko Corporation) was sliced to obtain a dielectric layer according to Example 8 having a thickness of 0.79 mm. The dielectric layer according to Example 8 was joined to the electrically conductive layer according to Example 1, with an acrylic adhesive having a thickness of 30 µm being present between the 25-µm-thick PET layer of the electrically conductive layer according to Example 1 and the dielectric layer according to Example 8. Next, the dielectric layer according to Example 8 was joined to the resistive layer according to Example 1, with an acrylic adhesive having a thickness of 30 µm being present between the dielectric layer according to Example 8 and the resistive layer according to Example 1, in the state in which the principal surface formed by the support of the resistive layer according to Example 1 faces the dielectric layer according to Example 8. An electromagnetic wave absorber according to Example 8 was obtained in this manner.

Example 9

300 parts by weight of a carbonyl iron powder YW1 available from New Metals and Chemicals Corporation, Ltd. was added to 100 parts by weight of an acrylic resin (KURARITY LA2330 available from KURARAY CO., LTD.). The resultant mixture was kneaded with a mixing roll and then press-molded at 120° C. to produce a sheet-shaped dielectric layer (a dielectric layer according to Example 9) having a thickness of 1200 µm. The dielectric layer according to Example 9 had a relative permittivity of 6.60. On a film-like support (Mitsubishi DIAFOIL with a thickness of 50 µm, available from Mitsubishi Chemical Corporation) made of polyester, an electrically conductive functional layer was formed by sputtering using an ITO containing 10 weight % of $SnO_2$ to have a sheet resistance of 20Ω/□. An electrically conductive layer according to Example 9 was thus produced. The dielectric layer according to Example 9 was placed on the electrically conductive layer according to Example 9 in the state in which the electrically conductive functional layer of the electrically conductive layer according to Example 9 faced the dielectric layer according to Example 9. An electromagnetic wave absorber according to Example 9 was obtained in this manner.

Example 10

An electromagnetic wave absorber according to Example 10 was produced in the same manner as in Example 9, except that the electrically conductive layer according to Example 1 was used instead of the electrically conductive layer according to Example 9. The 25-μm-thick PET layer of the electrically conductive layer according to Example 1 faced the dielectric layer according to Example 9.

Example 11

An ionomer resin (product name: Himilan 1855, available from Du Pont-Mitsui Polychemicals Co., Ltd.) was kneaded with a mixing roll and then press-molded at 120° C. to produce a dielectric layer according to Example 11 having a thickness of 565 μm. The dielectric layer according to Example 11 had a relative permittivity of 2.44. An electromagnetic wave absorber according to Example 11 was obtained in the same manner as in Example 1, except that the dielectric layer according to Example 11 was used instead of the dielectric layer according to Example 1.

Example 12

Linear low-density polyethylene (LLDPE) (product name: ULTZEX 2022L, available from Prime Polymer Co., Ltd.) was kneaded with a mixing roll and then press-molded at 120° C. to produce a dielectric layer according to Example 12 having a thickness of 580 μm. The dielectric layer according to Example 12 had a relative permittivity of 2.30. An electromagnetic wave absorber according to Example 12 was obtained in the same manner as in Example 7, except that the dielectric layer according to Example 12 was used instead of the dielectric layer according to Example 7.

Example 13

High density polyethylene (HDPE) (product name: HI-ZEX 2100J, available from Prime Polymer Co., Ltd.) was kneaded with a mixing roll and then press-molded at 120° C. to produce a dielectric layer according to Example 13 having a thickness of 595 μm. The dielectric layer according to Example 13 had a relative permittivity of 2.30. An electromagnetic wave absorber according to Example 13 was obtained in the same manner as in Example 7, except that the dielectric layer according to Example 13 was used instead of the dielectric layer according to Example 7.

Example 14

An EVA resin (EVAFLEX EV250, with a relative permittivity of 2.45, available from Du Pont-Mitsui Fluorochemicals Co., Ltd.) was press-molded at 120° C. to produce a dielectric layer according to Example 14 having a thickness of 571 μm. As an electrically conductive layer according to Example 14, an aluminum foil-including two-layer structure PET film, available from UACJ Corporation, including a 9-μm-thick PET layer and a 7-μm-thick aluminum foil was prepared. An electromagnetic wave absorber according to Example 14 was obtained in the same manner as in Example 1, except that the dielectric layer according to Example 14 was used instead of the dielectric layer according to Example 1 and the electrically conductive layer according to Example 14 was used instead of the electrically conductive layer according to Example 1. The dielectric layer according to Example 14 was placed on the 7-μm-thick aluminum foil of the electrically conductive layer according to Example 14.

Example 15

An electromagnetic wave absorber according to Example 15 was obtained in the same manner as in Example 1, except that a 100-μm-thick aluminum foil was used instead of the electrically conductive layer according to Example 1.

Example 16

As an electrically conductive layer according to Example 16, an aluminum-deposited film (product name: CP WS20, substrate: a biaxially-oriented polypropylene (BOPP) film, thickness of the substrate: 20 μm, available from Mitsui Chemicals Tohcello, Inc.) was prepared. An electromagnetic wave absorber according to Example 16 was obtained in the same manner as in Example 3, except that the electrically conductive layer according to Example 16 was used instead of the electrically conductive layer according to Example 3. The dielectric layer according to Example 3 was placed on the aluminum-deposited film that was the electrically conductive layer according to Example 16.

Comparative Example 1

300 parts by weight of barium titanate powder (product name: BT-01, available from Sakai Chemical Industry Co., Ltd.) was added to 100 parts by weight of an EVA resin (EVAFLEX EV250 available from Du Pont-Mitsui Fluorochemicals Co., Ltd.), and the resultant mixture was kneaded with a mixing roll. Then the kneaded mixture was press-molded at 120° C. to obtain a dielectric layer according to Comparative Example 1 having a thickness of 242 μm. The dielectric layer according to Comparative Example 1 had a relative permittivity of 14.00. An electromagnetic wave absorber according to Comparative Example 1 was obtained in the same manner as in Example 1, except that the dielectric layer according to Comparative Example 1 was used instead of the dielectric layer according to Example 1.

Comparative Example 2

400 parts by weight of a carbonyl iron powder YW1 available from New Metals and Chemicals Corporation, Ltd. was added to 100 parts by weight of an acrylic resin (KURARITY LA2330 available from KURARAY CO., LTD.). The resultant mixture was kneaded with a mixing roll and then press-molded at 120° C. to produce a sheet-shaped dielectric layer (a dielectric layer according to Comparative Example 2) having a thickness of 1200 μm. The dielectric layer according to Comparative Example 2 had a relative permittivity of 10.30. The dielectric layer according to Comparative Example 2 was placed on the electrically conductive layer according to Example 1 in the state in which the 25-μm-thick PET layer of the electrically conductive layer according to Example 1 faced the dielectric layer according to Comparative Example 2. An electromagnetic wave absorber according to Comparative Example 2 was obtained in this manner.

Comparative Example 3

As a dielectric layer according to Comparative Example 3, a polyester film (a PET film), available from Toray Industries, Inc., having a thickness of 480 μm was prepared. The dielectric layer according to Comparative Example 3 had a relative permittivity of 3.20. An electromagnetic wave absorber according to Comparative Example 3 was obtained in the same manner as in Example 7, except that the dielectric layer according to Comparative Example 3 was used instead of the dielectric layer according to Example 7.

Comparative Example 4

As a dielectric layer according to Comparative Example 4, a polycarbonate (PC) sheet, available from SUMI-KAACRYL CO., LTD., having a thickness of 500 µm was prepared. The dielectric layer according to Comparative Example 4 had a relative permittivity of 2.90. An electromagnetic wave absorber according to Comparative Example 4 was obtained in the same manner as in Example 7, except that the dielectric layer according to Comparative Example 4 was used instead of the dielectric layer according to Example 7.

[Young's Modulus]

Each of the dielectric layers and each of the electrically conductive layers used in Examples and Comparative Examples were measured for Young's modulus (tensile elastic modulus) in compliance with JIS K7161-1:2014 at a normal temperature, and the product (Et) of the Young's modulus and the thickness was calculated with regard to each of the dielectric layers and each of the electrically conductive layers. Table 1 shows the results.

[Relative Permittivity of Dielectric Layer]

Each of the dielectric layers in Examples and Comparative Examples was measured for relative permittivity at 10 GHz by a cavity resonator perturbation method using a network analyzer (product name: N5230C, available from Agilent Technologies, Inc.) and a cavity resonator (cavity resonator CP531 available from Kanto Electronics Application Development Inc.). Table 1 shows the results.

[Bending Properties and Adhesiveness]

A state of each of the electromagnetic wave absorbers according to Examples and Comparative Examples adhered using a 0.05-mm-thick transparent adhesive sheet (CS9862UA available from Nitto Denko Corporation) to a steel plate bent to R100 (curvature radius: 100 mm) was observed to evaluate it according to a measure described below. Table 1 shows the results.

a: The electromagnetic wave absorber deformed along a curved face of the steel plate and was fit tightly to the steel plate after adhered thereto.

b: Although the electromagnetic wave absorber deformed along a curved face of the steel plate, the electromagnetic wave absorber was creased.

x: The electromagnetic wave absorber failed to deform along a curved face of the steel plate, and it was difficult to adhere the electromagnetic wave absorber.

[Electromagnetic wave absorption characteristics]

The amount of reflection and absorption was measured per frequency under the conditions that a millimeter wave of 60 GHz to 90 GHz was incident on each of the electromagnetic wave absorbers according to Examples and Comparative Examples at an incidence angle of 15° in compliance with JIS R 1679:2007. Based on the measurement results, the maximum amount of reflection and absorption, the maximum peak frequency, and the frequency bandwidth in which the amount of reflection and absorption was 20 dB or more were determined. Table 2 shows the results.

[Electromagnetic Wave Absorption Characteristics after Durability Test]

A durability test was conducted on each of the electromagnetic wave absorbers according to Examples and Comparative Examples under the conditions that each of the electromagnetic wave absorbers fixed to and along a steel plate bent to R100 (curvature radius: 100 mm) was stored in an environment at a temperature of 40° C. and a relative humidity of 92% for 500 hours. Then each of the electromagnetic wave absorbers according to Examples and Comparative Examples was taken off from the steel plate. Thereafter, the amount of reflection and absorption was measured per frequency under the conditions that a millimeter wave of 60 GHz to 90 GHz was incident on each of the electromagnetic wave absorbers according to Examples and Comparative Examples at an incidence angle of 15° in compliance with JIS R 1679:2007. Based on the measurement results, the maximum amount of reflection and absorption after the durability test was determined. Each of the electromagnetic wave absorbers according to Examples and Comparative Examples was evaluated as below based on the maximum amount of reflection and absorption before and after the durability test. Table 2 shows the results.

a: No decrease in the maximum amount of reflection and absorption was observed and the maximum amount of reflection and absorption after the durability test was 20 dB or more.

b: A decrease in the maximum amount of reflection and absorption was observed but the maximum amount of reflection and absorption after the durability test was 20 dB or more.

x: The maximum amount of reflection and absorption after the durability test was less than 20 dB.

Comparisons between Examples 1 to 16 and Comparative Examples 1 and 2 reveal that when the dielectric layer has a relative permittivity of 10 or less, the electromagnetic wave absorber can achieve a good amount (20 dB or more) of reflection and absorption in a broad bandwidth. Comparisons between Examples 1 to 16 and Comparative Examples 3 and 4 reveals that the electromagnetic wave absorber can be attached easily to a non-flat face when the product of the Young's modulus of the dielectric layer and the thickness of the dielectric layer is 0.1 to 1000 MPa·mm. In addition, comparison between Example 3 and Example 14 reveals that the electromagnetic wave absorber has high durability when the support for the electrically conductive functional layer is positioned between the electrically conductive functional layer and the dielectric layer.

TABLE 1

| | | Dielectric layer (or magnetic layer) | | | | Electrically conductive layer |
|---|---|---|---|---|---|---|
| | Material | Thickness t [mm] | Young's modulus E [MPa] | Young's modulus × thickness (Et) [MPa · mm] | Relative permittivity | Electrically conductive functional layer |
| Example 1 | Acrylic resin | 0.560 | 1 | 0.56 | 2.55 | Al foil 7 µm |
| Example 2 | Acrylic resin | 0.560 | 1 | 0.56 | 2.55 | ITO |
| Example 3 | EVA | 0.560 | 13 | 7.3 | 2.45 | Al foil 7 µm |
| Example 4 | EVA 50 parts by weight of BaTiO$_3$ | 0.456 | 16 | 7.3 | 3.90 | Al foil 7 µm |

TABLE 1-continued

| | Material | | | | | |
|---|---|---|---|---|---|---|
| Example 5 | EVA 100 parts by weight of BaTiO₃ | 0.397 | 18 | 7.1 | 5.19 | Al foil 7 μm |
| Example 6 | EVA 200 parts by weight of BaTiO₃ | 0.336 | 22 | 7.4 | 7.25 | Al foil 7 μm |
| Example 7 | Olefin foam | 0.820 | 5 | 4.1 | 1.07 | Al foil 7 μm |
| Example 8 | Polyester foam | 0.790 | 7 | 5.5 | 1.09 | Al foil 7 μm |
| Example 9 | Acrylic resin 300 parts by weight of iron powder | 1.200 | 8 | 9.6 | 6.60 | ITO |
| Example 10 | Acrylic resin 300 parts by weight of iron powder | 1.200 | 8 | 9.6 | 6.60 | Al foil 7 μm |
| Example 11 | Ionomer resin | 0.565 | 35 | 20 | 2.44 | Al foil 7 μm |
| Example 12 | LLDPE | 0.580 | 180 | 104 | 2.30 | Al foil 7 μm |
| Example 13 | HDPE | 0.595 | 875 | 521 | 2.30 | Al foil 7 μm |
| Example 14 | EVA | 0.571 | 13 | 7.4 | 2.45 | Al foil 7 μm |
| Example 15 | Acrylic resin | 0.560 | 1 | 0.56 | 2.55 | Al foil 100 μm |
| Example 16 | EVA | 0.560 | 13 | 7.3 | 2.45 | Al-deposited film |
| Comparative Example 1 | EVA 300 parts by weight of BaTiO₃ | 0.242 | 30 | 7.3 | 14.00 | Al foil 7 μm |
| Comparative Example 2 | Acrylic resin 400 parts by weight of iron powder | 1.200 | 11 | 13.2 | 10.30 | Al foil 7 μm |
| Comparative Example 3 | PET | 0.480 | 4700 | 2256 | 3.20 | Al foil 7 μm |
| Comparative Example 4 | PC | 0.500 | 2250 | 1125 | 2.90 | Al foil 7 μm |

| | | Electrically conductive layer | | Resistive layer | |
|---|---|---|---|---|---|
| | Support | Young's modulus E [MPa] | Young's modulus × thickness (Et) [MPa · mm] | Material of resistive functional layer/material of support | Bending properties and adhesiveness |
| Example 1 | PET 25 μm PET 9 μm | 5100 | 204 | ITO/PET | a |
| Example 2 | PET 38 μm | 4700 | 179 | ITO/PET | b |
| Example 3 | PET 25 μm PET 9 μm | 5100 | 204 | ITO/PET | a |
| Example 4 | PET 25 μm PET 9 μm | 5100 | 204 | ITO/PET | a |
| Example 5 | PET 25 μm PET 9 μm | 5100 | 204 | ITO/PET | a |
| Example 6 | PET 25 μm PET 9 μm | 5100 | 204 | ITO/PET | a |
| Example 7 | PET 25 μm PET 9 μm | 5100 | 204 | ITO/PET | a |
| Example 8 | PET 25 μm PET 9 μm | 5100 | 204 | ITO/PET | a |
| Example 9 | PET 50 μm | 4700 | 235 | — | a |
| Example 10 | PET 25 μm PET 9 μm | 5100 | 204 | — | a |
| Example 11 | PET 25 μm PET 9 μm | 5100 | 204 | ITO/PET | b |
| Example 12 | PET 25 μm PET 9 μm | 5100 | 204 | ITO/PET | a |
| Example 13 | PET 25 μm PET 9 μm | 5100 | 204 | ITO/PET | a |
| Example 14 | PET 9 μm | 3100 | 50 | ITO/PET | a |
| Example 15 | — | 69000 | 6900 | ITO/PET | a |
| Example 16 | BOP 20 μm | 400 | 8 | ITO/PET | a |
| Comparative Example 1 | PET 25 μm PET 9 μm | 5100 | 204 | ITO/PET | a |
| Comparative Example 2 | PET 25 μm PET 9 μm | 5100 | 204 | — | a |
| Comparative Example 3 | PET 25 μm PET 9 μm | 5100 | 204 | ITO/PET | x |
| Comparative Example 4 | PET 25 μm PET 9 μm | 5100 | 204 | ITO/PET | x |

TABLE 2

| | Electromagnetic wave absorption characteristics | | | |
|---|---|---|---|---|
| | Frequency bandwidth [dB] in which the amount of reflection and absorption is 20 dB or more | Maximum peak frequency [Hz] | Maximum amount of reflection and absorption [dB] | Reflection and absorption characteristics after durability test |
| Example 1 | 15.6 | 74.6 | 33 | a |
| Example 2 | 15.2 | 74.9 | 30 | b |
| Example 3 | 14.3 | 75.3 | 31 | a |
| Example 4 | 19.7 | 82.5 | 35 | a |
| Example 5 | 10.3 | 78.2 | 24 | a |
| Example 6 | 3.2 | 68.0 | 21 | a |
| Example 7 | 17.2 | 73.3 | 29 | a |
| Example 8 | 16.2 | 72.7 | 29 | a |
| Example 9 | 2.6 | 82.1 | 22 | b |
| Example 10 | 2.9 | 79.8 | 24 | a |
| Example 11 | 14.1 | 76.4 | 28 | a |
| Example 12 | 14.0 | 76.6 | 29 | a |
| Example 13 | 13.8 | 76.3 | 29 | a |
| Example 14 | 12.9 | 73.1 | 26 | b |
| Example 15 | 15.5 | 75.0 | 33 | a |
| Example 16 | 14.0 | 74.5 | 28 | — |
| Comparative Example 1 | 0.0 | 78.2 | 16 | x |
| Comparative Example 2 | 0.0 | 66.0 | 15 | x |
| Comparative Example 3 | 10.2 | 85.2 | 29 | — |
| Comparative Example 4 | 9.3 | 62.3 | 33 | — |

The invention claimed is:

1. An electromagnetic wave absorber comprising:
a first layer that is a dielectric layer or a magnetic layer; and
an electrically conductive layer that is provided on at least one surface of the first layer, wherein
a product of a Young's modulus of the first layer and a thickness of the first layer is 0.1 to 1000 MPa·mm, and
the first layer has a relative permittivity of 1 to 10.

2. The electromagnetic wave absorber according to claim 1, wherein the Young's modulus of the first layer is 2000 MPa or less.

3. The electromagnetic wave absorber according to claim 1, wherein the first layer contains a polymer material.

4. The electromagnetic wave absorber according to claim 1, wherein the first layer is a foam.

5. The electromagnetic wave absorber according to claim 1, wherein at least one of a dielectric substance and a magnetic substance is dispersed in the first layer.

6. The electromagnetic wave absorber according to claim 1, wherein a product of a Young's modulus of the electrically conductive layer and a thickness of the electrically conductive layer is 12000 MPa·mm or less.

7. The electromagnetic wave absorber according to claim 1, wherein the electrically conductive layer contains a metal.

8. The electromagnetic wave absorber according to claim 1, wherein
the electrically conductive layer includes a support and an electrically conductive functional layer that has electrical conductivity and is in contact with the support, and
the support is disposed between the first layer and the electrically conductive functional layer and the support protects the electrically conductive functional layer.

9. The electromagnetic wave absorber according to claim 1, further comprising a resistive layer that is provided on at least one surface of the first layer, wherein
the first layer is the dielectric layer and disposed between the resistive layer and the electrically conductive layer.

10. The electromagnetic wave absorber according to claim 9, wherein the resistive layer has a sheet resistance of 200 to 600 Ω/□.

11. The electromagnetic wave absorber according to claim 1, wherein the electromagnetic wave absorber exhibits an electromagnetic wave absorption of 20 dB or more in a bandwidth of 2 GHz or more included in a frequency band of 50 to 100 GHz.

12. The electromagnetic wave absorber according to claim 1, further comprising an adhesive layer disposed on an external side of the electrically conductive layer.

13. A molded article with an electromagnetic wave absorber, comprising:
a molded article; and
the electromagnetic wave absorber according to claim 1 attached to the molded article.

* * * * *